(12) United States Patent
Sachan et al.

(10) Patent No.: US 9,001,570 B1
(45) Date of Patent: Apr. 7, 2015

(54) PSEUDO RETENTION TILL ACCESS MODE ENABLED MEMORY

(71) Applicant: Texas Instruments Incorporated, Dallas, TX (US)

(72) Inventors: Rashmi Sachan, Bangalore (IN); Parvinder Rana, Bangalore (IN); Abhishek Kesarwani, Bangalore (IN); Robert Pitts, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 50 days.

(21) Appl. No.: 14/040,297

(22) Filed: Sep. 27, 2013

(51) Int. Cl.
*G11C 8/00* (2006.01)
*G11C 11/418* (2006.01)
*G11C 11/417* (2006.01)
*G11C 11/24* (2006.01)

(52) U.S. Cl.
CPC ............ *G11C 11/418* (2013.01); *G11C 11/417* (2013.01); *G11C 11/24* (2013.01)

(58) Field of Classification Search
CPC ................. G11C 11/418; G11C 11/24; G11C 11/40615; G11C 11/417
USPC ......... 365/154, 189.05, 222, 227, 228, 230.06
See application file for complete search history.

(56) References Cited

U.S. PATENT DOCUMENTS

| 6,449,204 B1 * | 9/2002 | Arimoto et al. ............... 365/222 |
| 8,218,376 B2 | 7/2012 | Seshadri |
| 8,923,090 B1 * | 12/2014 | Evans et al. .............. 365/230.06 |

* cited by examiner

*Primary Examiner* — Tan T. Nguyen
(74) *Attorney, Agent, or Firm* — John R. Pessetto; Frank D. Cimino

(57) ABSTRACT

A memory configurable to be used in an RTA mode includes an input latch configured to receive an input address bus and to generate a latched address bus that corresponds to a memory location. An address flop is configured to save the latched address and to generate a flopped address. A first block address pre-decoder stage is configured to generate a pre-decoded latched address to an RTA generation logic in response to the latched address bus; and a second block address pre-decoder configured to generate a pre-decoded flopped address to the RTA generation logic in response to the flopped address. The RTA generation logic generates an RTA enable signal one clock cycle before a memory block access, to activate a memory block corresponding to the memory location, such that an array supply voltage of the memory block starts charging one clock cycle before a memory block access.

20 Claims, 6 Drawing Sheets

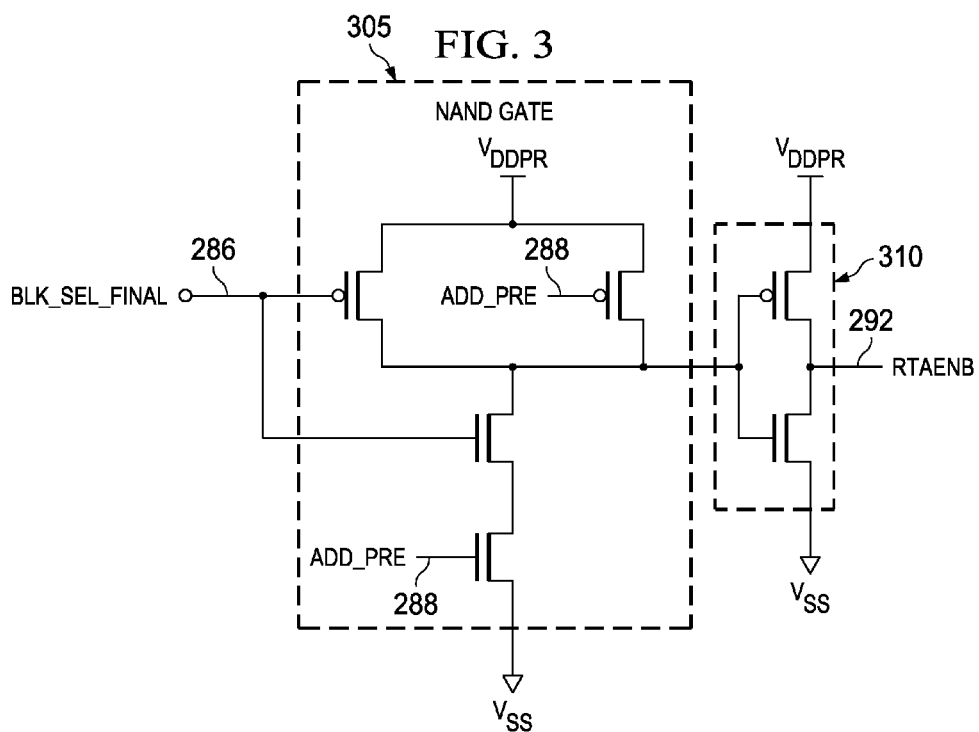
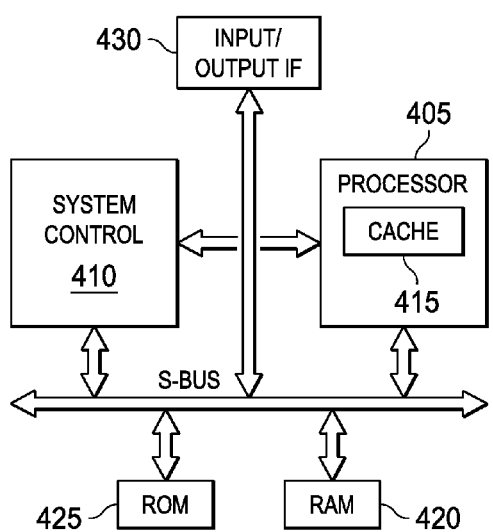

PSEUDO RETENTION TILL ACCESS MODE ENABLED MEMORY

TECHNICAL FIELD

Embodiments of the disclosure relate to semiconductor memories capable of operating in retention till access mode.

BACKGROUND

A memory, in particular, a static random access memory (SRAM), is configured to operate in retention till access (RTA) mode to reduce active array leakage by keeping the array supply at a diode voltage level below the supply voltage. In general, an SRAM is divided into blocks of 32 rows or 16 rows. When operating, a switch is used to bring a voltage of a block being accessed in the SRAM, to the full voltage. In order to support the high memory performance, the size of the switch needs to be significantly high. This results in high switch area and high peak current. Further, large on die decoupling capacitance is needed to support high peak current which in turn increases the overall system on chip (SoC) area and leakage. As the peak current depends on the SRAM usage in the SoC, it becomes challenging to predict peak current in the system. This leads to conservative value of decoupling capacitance requirements.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An embodiment provides a memory configurable to be used in an RTA mode. The memory includes an input latch configured to receive an input address bus and to generate a latched address bus that corresponds to a memory location in the memory, an address flop configured to save the latched address and to generate a flopped address; a first block address pre-decoder stage configured to generate a pre-decoded latched address to an RTA generation logic in response to the latched address bus; and a second block address pre-decoder configured to generate a pre-decoded flopped address to the RTA generation logic in response to the flopped address. The RTA generation logic is configured to generate an RTA enable signal one clock cycle before a memory block access, to activate a block in the memory corresponding to the memory location, such that an array supply voltage of the memory block starts charging one clock cycle before a memory block access. The memory includes an SRAM.

Another embodiment provides a method for operating an SRAM in RTA mode. First, a latched address bus is generated that corresponds to an SRAM, in response to an input address bus. Then, a flopped address is generated in response to the latched address. A pre-decoded latched address is generated that is provided to an RTA generation logic in response to the latched address. A pre-decoded flopped address is generated that is provided to the RTA generation logic in response to the flopped address. Further, an RTA enable signal is generated to activate the SRAM such that an array supply voltage of the SRAM charges one clock cycle earlier than a memory block access.

Other aspects and example embodiments are provided in the Drawings and the Detailed Description that follows.

BRIEF DESCRIPTION OF THE VIEWS OF DRAWINGS

FIG. 3 is a circuit diagram of an RTA logic of FIG. 2(a) according to an embodiment;

FIG. 4 illustrates an example of an integrated circuit, in the form of an SoC having the psuedo RTA enabled memory.

DETAILED DESCRIPTION OF THE EMBODIMENTS

Figure 1A:
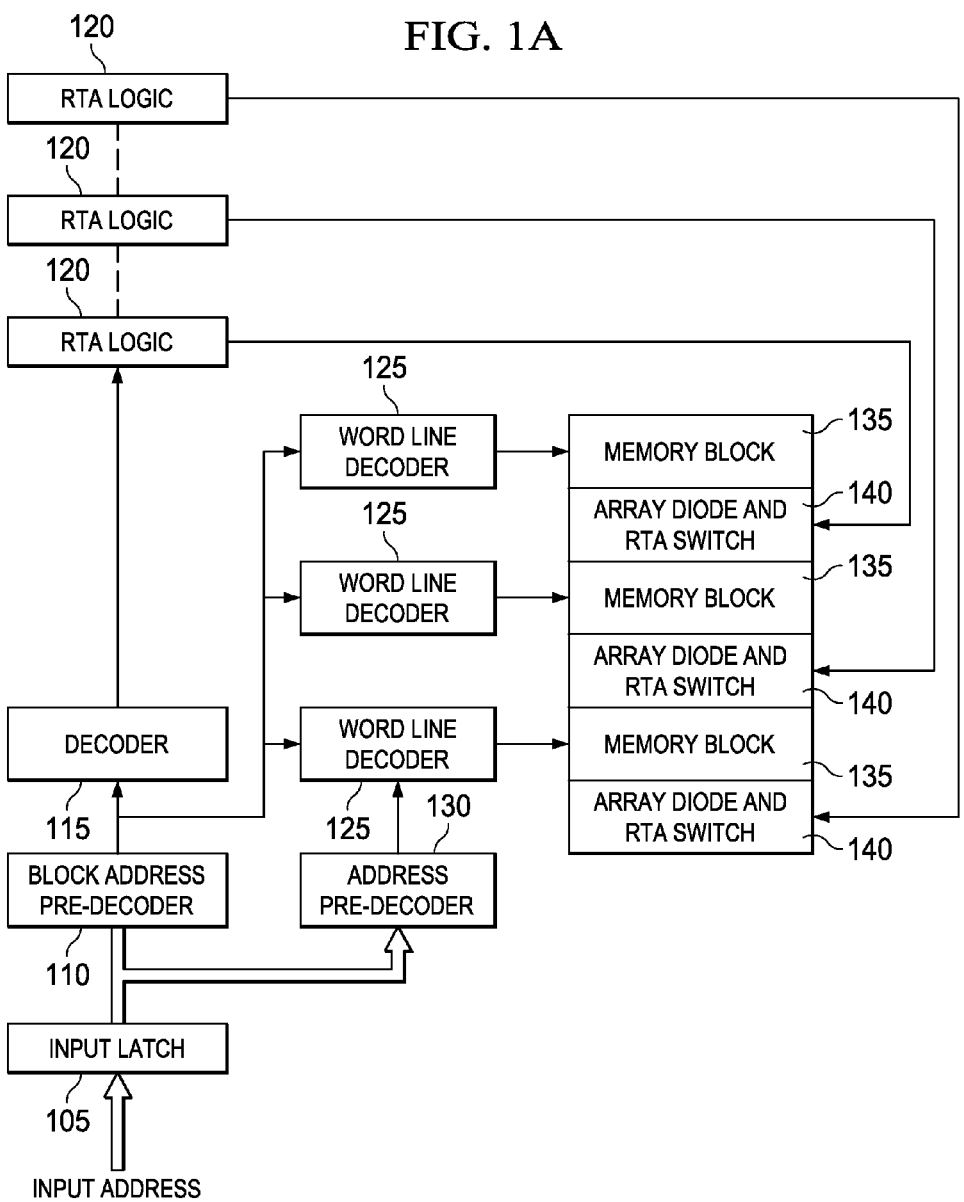
FIG. 1(a) is a block diagram of an RTA enabled memory.

FIG. 1(a) is a block diagram of an retention till access (RTA) enabled memory, for example a static random access memory (SRAM). The RTA enabled memory includes an input latch 105, coupled to a block address pre-decoder 110 and an address pre-decoder 130. Outputs of the block address pre-decoder 110 and the address pre-decoder 130 are connected to a word line decoder 125. Output of the block address pre-decoder 110 is also connected to a decoder 115. An output of the decoder is connected to an RTA logic 120. FIG. 1(a) includes several RTA logics 120 coupled to each other and several word line decoders 125 coupled to each other. For the sake of simplicity, operation and connection of only one RTA logic 120, and word line decoder 125 is explained.

An output of the RTA logic 120 is connected to an array diode and RTA switch 140 that is further connected to a memory block 135. There are several memory blocks shown in FIG. 1(a), each having an array diode and an RTA switch that receives the RTA enable signal from corresponding RTA logic. The memory includes array of memory cells arranged in rows and columns, and a memory block (for example, 135) includes a particular set of number of rows. The output of the block address pre-decoder 110 is connected to a word line decoder 125. An output of the word line decoder 125 is connected to the memory block 135.

Operationally, the input latch 105 receives an input address on a bus. The input latch 105 latches the input data when a system clock is selected and generates the latched address output. Most significant bits (MSB) of the latched address output required to select a particular block in the memory block 135 are provided to the block address pre-decoder 110. Similarly, least significant bits (LSB) of the latched address output are provided to the address pre-decoder 130. The block address pre-decoder 110 decodes the MSB of the latched address output using logic gates and generates a pre-decoded address that is provided to the decoder 115. The decoder 115 includes logic gates that generate a block select address which is provided to the RTA logic 120. The RTA logic 120 includes logic gates that are configured to generate an RTA enable signal. The RTA enable signal activates an RTA switch and diode combination 140 that starts restoring an array supply voltage (VDDAR) from a retention voltage for the memory block 135.

The address pre-decoder 130 receives the LSB of the latched address output and generates a pre-decoded address that is provided to a word line decoder 125. The word line decoder 125 also receives the pre-decoded signal from the block address pre-decoders 110 and generates a word line. The word line decoder 125 selects a row in the memory block 135 that is intended to be accessed. Accessing the memory block refers to an operation (read/write) to be performed in the memory block 135.

Figure 1B:
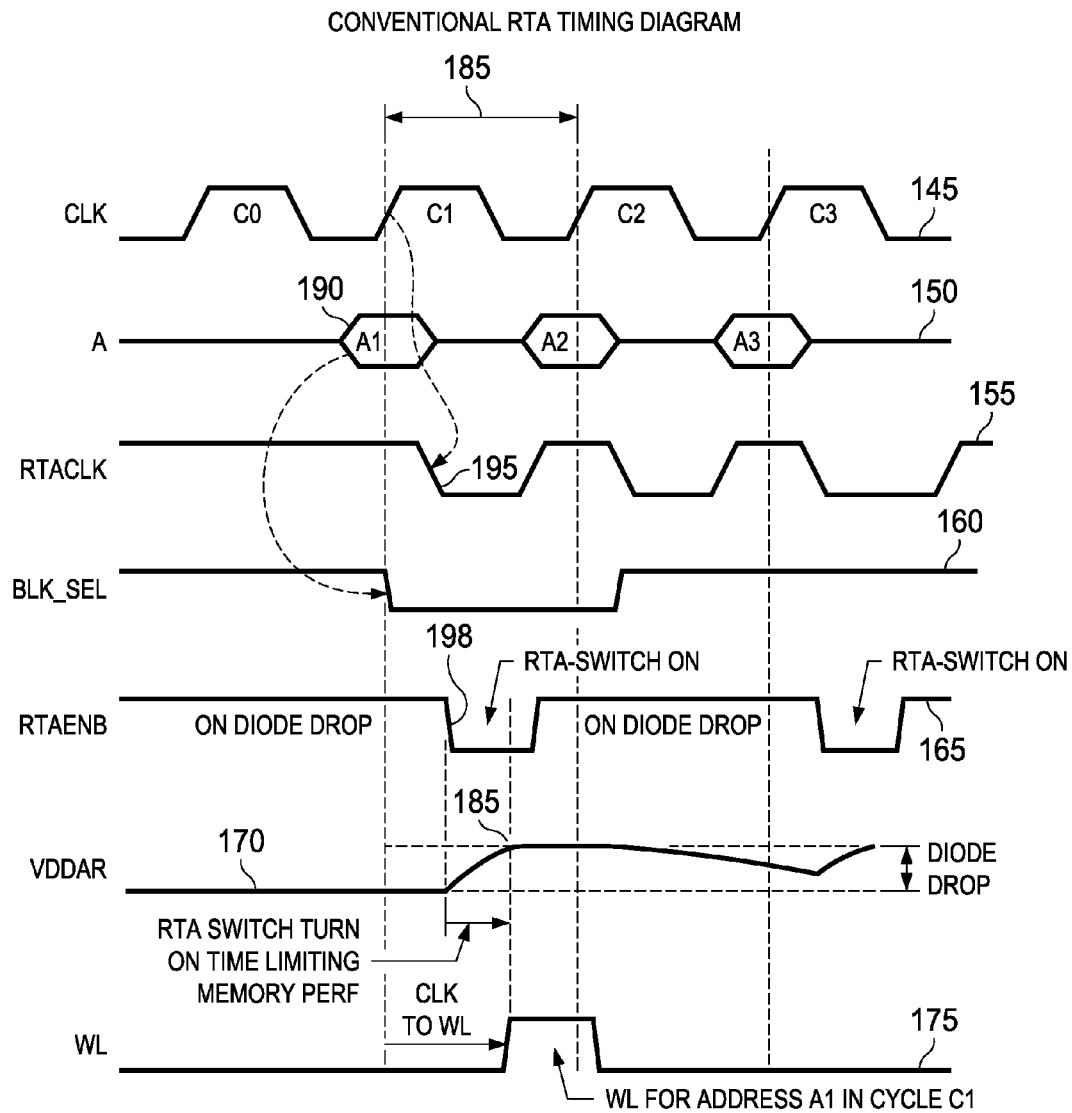
FIG. 1(b) is a timing diagram illustrating the operation of the RTA enabled memory of FIG. 1(a)

Referring now to FIG. 1(b), a timing diagram is illustrated that explains the operation of the RTA enabled memory of FIG. 1(a). 'CLK' 145 represents the input clock signal, 'A' 150 represents the input address, 'RTACLK' 155 represents the RTA clock, 'BLK_SEL' 160 represents the block select signal, 'RTAENB' 165 represents the RTA enable signal, 'VDDAR' 170 represents the array supply voltage and 'WL' represents the word line signal 175 for a selected row in the memory block 135.

Accessing operation of the memory block (read/write) starts at a rising edge of the CLK at clock period 185. RTACLK 195 is then generated in response to the rising edge of CLK at clock period 185. BLK_SEL 160 is generated in response to the address A1 190 and the rising edge of the RTACLK 195. Then, RTA enable signal 165 is generated using BLK_SEL 160. When the RTAENB 165 is high, a diode is activated which keeps the array supply voltage to a retention voltage. When the RTAENB (165) is low 198, an RTA switch 140 gets activated that brings a voltage of a block being accessed to full voltage. It can be seen that the VDDAR is at a diode drop 180, which is at retention voltage, before accessing the memory block. VDDAR starts ramping to full voltage 185 at the falling edge of the RTAENB, before accessing the memory block. The WL 175 for a particular row in a selected memory block will go high in the same clock period C1. It is noted that before WL 175 goes high, the VDDAR 170 should be restored to full value. To ensure that the VDDAR 170 goes to full value, the size of the RTA switch 140 needs to be significantly high. This results in high switch area and high peak current. Further, large on die decoupling capacitance are needed to support high peak current which in turn increases the overall system on chip (SoC) area and leakage. As the peak current depends on the SRAM usage in the SoC, it becomes challenging to predict peak current in the system. This leads to conservative value of decoupling capacitance requirements.

Figure 2A:
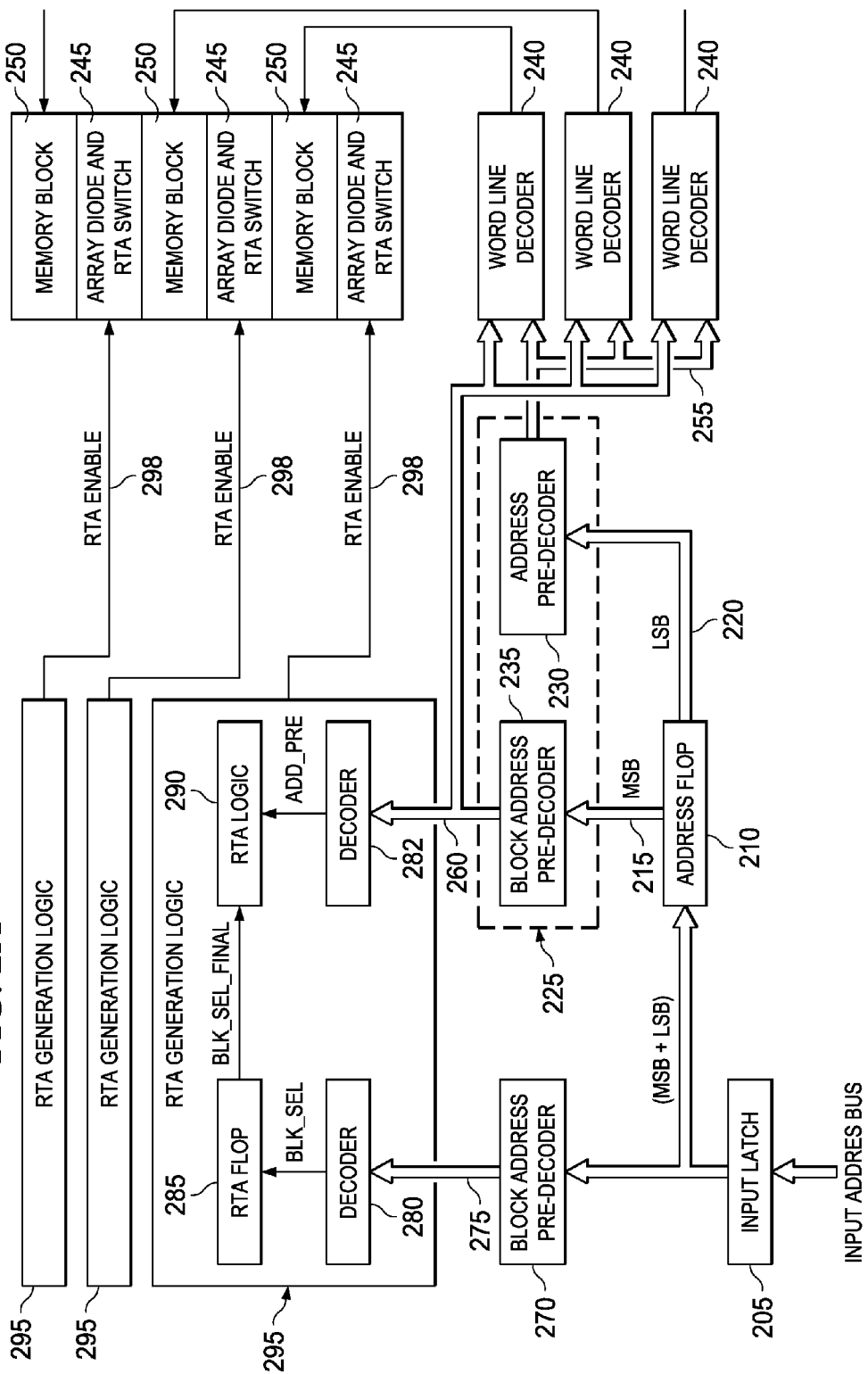
FIG. 2(a) is a block diagram of a pseudo RTA enabled memory according to an embodiment.

FIG. 2(a) is a block diagram of a pseudo RTA enabled memory; hereinafter the RTA enabled memory, according to an embodiment. The RTA enabled memory includes an input latch 205 that generates a latched address output to a block address pre-decoder 270 (first block address pre-decoder stage) and to an address flop 210. Address flops 210 includes equal number of flops as number of address lines. Most significant bits (MSBs) of the latched address output required to select a particular block in the memory block 250 are provided to the block address pre-decoder 270. Similarly, least significant bits (LSB) and MSBs of the latched address output are provided to an address flop 210. The address flop generates MSBs of the flopped address output to the block address pre-decoder 235. Similarly, the address flop generates the LSBs of the flopped address output to the block address pre-decoder 230 on lines 215 and 220 respectively. The address pre-decoder 230 and the block address pre-decoder 235 together forms the second pre-decoder stage 225.

The output of the first block address pre-decoder stage 270, pre-decoded latched address, is connected to the RTA generation logic 295 on line 275 The output of the block address pre-decoder 235 (a pre-decoded flopped address) is also connected to the RTA generation logic 295 on line 260 The RTA generation logic 295 includes a set of decoders 280 and 282 that receives the pre-decoded latched address on line 275 and a pre-decoded flopped address on line 260. The output of the decoder 280 (BLK_SEL) is connected to a flop 285 and the output of the decoder 282 (ADD_PRE) is connected to an RTA logic 290. The decoders 280 and 282 include a combination of NAND gates and inverters. An output of the RTA flop 285 (BLK_SEL_FINAL) is connected to the RTA logic 290.

The RTA logic 290 includes a NAND gate followed by an inverter. The RTA logic 290 generates the RTA enable signal on line 298. It is noted that the RTA enabled memory implementation includes several RTA generation logics, similar to RTA generation logic 295, that generates RTA enable signals. Each RTA enable signal 298 corresponds to each memory block in a memory array (similar to memory block 250). The RTA enable signal 298 is connected to an RTA switch and array diode 245 that is connected to the memory block 250. It is noted that there are several memory blocks 250, each having an array diode and an RTA switch 245 that receives the RTA enable signal from corresponding RTA logic as illustrated in FIG. 2(a). The output of the address pre-decoder 230 and block address pre-decoder 235 are connected to a word line decoder 240. An output of the word line decoder 240 is connected to the memory block 250. The memory array includes array of memory cells arranged in rows and columns, and a memory block (for example, 250) includes a particular set of number of rows.

Operationally, the input latch 205 is configured to receive an input address bus and to generate a latched address bus using logic gates that corresponds to a memory location in the memory. The address flop 210 then saves the latched address bus and generates a flopped address. It is noted that the address flop 210 includes a set of flops corresponding to each address. For the sake of simplicity, only one flop is shown in FIG. 2A. The address flop 210 includes two latches, a slave latch and then a master latch (not shown in the figure) that operates in response to an internal clock signal that is generated from the input clock 'CLK'. First latch is in the slave orientation which will latch the data when memory is in inactive state. Second latch of the flop is in master orientation which will be transparent mode when memory is in inactive state. When the internal clock signal is high, the input latch 205 is in a transparent mode (input of latch gets passed to the output), master latch is in a latched mode (input of latch does not pass to the output) and slave latch is in transparent mode. When the clock signal is low, the input is closed and master latch is in transparent mode and the slave latch is in latched mode. The flopped address is generated at the output of the address flop 210. The flopped address includes MSBs of the input address that are required to select a particular block in the memory array are provided to a second block address pre-decoder stage 225. The second block address pre-decoder stage 225 includes an address pre-decoder 230 and a block address pre-decoder 235 that are configured to receive the LSB and the MSB of the flopped address output respectively on lines 220 and 215. The second block address pre-decoder 235 (hereinafter block address pre-decoder 235) is configured to generate a pre-decoded flopped address to the RTA generation logic 295 in response to the flopped address. The address pre-decoder 230, block address pre-decoder 235 and the block address pre-decoder 270 includes a combination of NAND gates and inverters that operates in response to the respective inputs.

Similarly, the decoder 280 in the RTA generation logic 295 includes a combination of NAND gates and inverters that operates in response to the respective inputs. The decoder 280 receives the pre-decoded latched address output (MSBs of the pre-decoded latched address output) and decodes the inputs and generates a decoded signal to the RTA flop 285. Similarly, the decoder 282 receives the pre-decoded flopped address and generates a decoded signal to the RTA logic 290. The RTA flop 285 includes a master latch and a slave latch (not shown in the figure) that operate in response to an RTA clock signal (that is generated from the input clock CLK). When the RTA clock signal is high (operation mode), the master latch is in a transparent mode (input of the latch passes to output) and slave latch is in latched mode (input of latch does not pass to the output). When the RTA clock signal is low, the master latch is in latched mode and the slave latch is in transparent mode.

The outputs of the flop 285 and the decoder 282 are connected to the RTA logic 290. A circuit implementation of the RTA logic is illustrated in FIG. 3. The RTA logic includes a NAND gate coupled to an inverter. The RTA logic 290 is configured to generate the RTA enable signal in response to the decoded latched address and the decoded flopped address. The RTA enable signal on line 298 is then provided to the RTA switch and array diode 245. The RTA enable signal activates an RTA switch and array diode 245 that in turn starts restoring the array supply voltage (VDDAR) from a retention voltage for the memory block 250. The word line decoder 240 also receives the pre-decoded flopped address from the block address and the output 255 of the address pre-decoder 230, 258 of the block address pre-decoder 235 (Need to add in FIG. 2a) and generates a word line. The word line selects a row in the memory block 250 that is intended to be accessed. Accessing the memory block 250 refers to an operation (read/write) to be performed in the memory block.

Figure 2B:
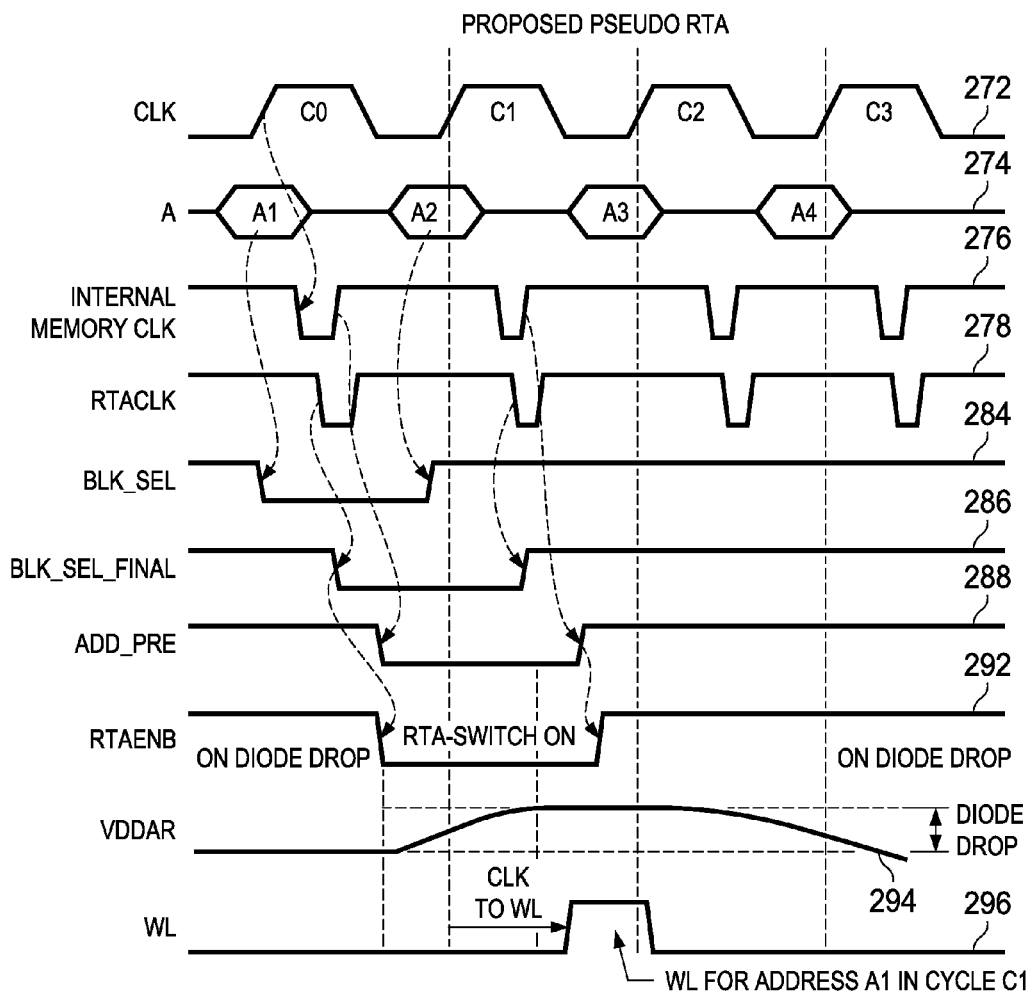
FIG. 2(b) is a timing diagram illustrating the operation of the pseudo RTA enabled memory of FIG. 2(a) according to an embodiment.

FIG. 2(b) is a timing diagram illustrating the operation of the pseudo RTA enabled memory of FIG. 2(a) according to an embodiment. 'CLK' 272 represents an external clock. A (A1, A2, A3, A4) 274 represents the input address bus. RTACLK, 278 represents the RTA clock signal generated in response to an internal memory clock. Internal memory clock 276 is generated in response to the external clock CLK. 'BLK_SEL' 284 represents the block select signal which is the output of the decoder 280. 'BLK_SEL_FINAL' 286 represents the block select final signal which is the output of the RTA flop 285. 'ADD_PRE' 288 represents the output of the decoder 282 that is generated in response to the pre-decoded flopped address. 'RTAENB' 292 represents the RTA enable signal that is generated from the RTA generation logic. VDDAR 294 represents the array supply voltage and WL 296 represents the word line signal for a selected row in the memory block 250.

In an embodiment, the RTA generation logic 295 generates an RTA enable signal 298 one clock cycle before a memory block access, to activate the memory block 250 corresponding to the memory location, such that an array supply voltage of the memory block starts charging one clock cycle before an intended read/write operation in the memory location. By charging the memory block one clock cycle before the intended operation, size of the RTA switch 245 and a peak current in the memory is reduced (since one clock cycle time is available to charge the array supply voltage of the block). It also improves performance of memory since charging of supply voltage (VDDAR) does not come in the memory read/write path. This is further explained with the help of the timing diagram in FIG. 2(a).

C1 represents the cycle of the memory access (read/write). According to an embodiment, since the array supply voltage (VDDAR) in the pseudo RTA enabled memory starts charging one clock cycle before an intended read/write operation, RTA switch and array diode 245 for a selected memory block 250 corresponding to address A1, gets activated in the C0 cycle.

First, the internal memory clock 276 is generated in response to the rising edge of the CLK 272 at clock period C0. Then, the RTACLK 278 is generated in response to the falling edge of internal memory clock 276. BLK_SEL 284 is generated in response to the address A1 and BLK_SEL_FINAL 286 is generated in response to BLK_SEL 284 and falling edge of the RTACLK 278. It is noted that the slave latch (first latch) of address flop 210 is in latched mode (input does not passes to output and output is latched) and master latch (second latch) is in transparent mode (input passes to output) when memory is in inactive mode (when memory is not being accessed and internal clock is in high state). And master latch (first latch) of the RTA flop is in transparent mode and slave latch (second latch) of the RTA flop is in latched mode in inactive state. Before accessing the memory, BLK_SEL 284 is present at the input of the slave latch of RTA flop 285 since master of the flop is in transparent mode. When memory is accessed, RTACLK 278 goes low and subsequently master latch goes into latched mode and slave latch goes into transparent mode. When slave latch is in transparent mode, BLK_SEL 284 is passed to the output of RTA flop 285 and generates the BLK_SEL_FINAL signal 286. The ADD_PRE 288 is the output of the decoder 282 that is generated in response to the pre-decoded flopped address. Input latch 205 and address flops 210 (which is the combination of slave latch and master latch) make a combination of 'master-slave-master' latch configuration which ensures that the address which was available in cycle C0 will available in the current cycle C1 as pre-decoded flopped address.

When the memory is in the inactive state (when the internal memory clock 276 is high), input address latch is in transparent mode, slave of the address flop 210 is in latched mode and master of the address flop 210 is in transparent mode. At this stage, address available as the input, is available at the slave of the address flop 210 since input latch is in transparent mode. The addresses will not pass to the next stage as slave of the address flop 210 is in the latched mode. When the memory is accessed (internal memory clock 276 is low), input latch is in latched mode, slave of the address flop 210 is in transparent mode and the master of the flop is in latched mode. At this stage, address from slave of the address flop 210 is moved to the input of the master of the flop since slave of the address flop is now in transparent mode. Addresses do not pass to the next stage since the master latches of the address flops 210 are in the latched mode. After completing the intended operation, memory goes in to inactive state (internal clock goes high). At this stage, the input latch 205 is in transparent mode, slave of the address flop 210 is in the latched mode and master of address flop 210 is in transparent mode. Since master of the address flop 210 is in transparent mode, it passes the previous address which was available at the input of the master latch to the next decoder stage that generates pre-decoded flopped address. It is noted that decoders 280 and 282 are static decoders having a set of NAND gates and inverters. It is also noted that the ADD_PRE is generated in response to pre-decoded flopped address. So, ADD_PRE is generated when memory goes in inactive state (internal clock goes high). 'RTAENB' 292 represents the RTA enable signal that is generated from the RTA generation logic in response to BLK_SEL_FINAL and ADD_PRE. RTA logic is a NAND gate coupled to an inverter which is explained in the description of FIG. 3.

When RTANENB 292 goes low, one of the memory blocks 250 is selected and that starts charging the array supply voltage (VDDAR). RTANENB 292 goes low in cycle C0 corresponding to memory block, which is going to be accessed in the next cycle C1. When BLK_SEL_FINAL signal 286 of memory block 250 goes low, it generates RTAENB falling edge that in turn starts charging the VDDAR 294 of memory block 250 (which is going to be accessed in the next cycle C1). When cycle C0 is completed, the internal memory clock 276 goes high that passes address from master of the address flop 210 to the next stage decoder which generates ADD_PRE 288 falling edge, which keeps RTAENB low till the next cycle C1 operation is completed. BLK_SEL_FINAL signal 286 changes its state at the falling edge of internal clock (when memory is selected for access) and ADD_PRE signal changes its status when internal memory clock 276 goes high (memory goes in inactive mode). Falling edge of the RTAENB 292 is triggered by the falling edge BLK_SEL_FINAL 286 in C0 cycle which turns on the RTA switch 245. The rising edge of the RTAENB 292 is triggered by the rising edge of the ADD_PRE 288 in cycle C1. Hence, the RTA switch corresponding to the memory block which is going to be accessed in the cycle C1, is activated at the starting edge of the cycle C0 and inactivated at the finishing edge of clock cycle C1. It is noted that in one embodiment, the RTA enable signal is configured to be active for 1.5 clock cycles. Accordingly, the RTA enable signal 292 gets selected one cycle before and stays active for next half cycle in which the read/write operation is performed in the memory.

According to an embodiment, the VDDAR 294 of the memory block 250 remains at retention voltage when a particular block is not accessed. When a memory block is going to be accessed at cycle C1, its VDDAR 294 starts charging at the active edge of cycle C0 in response to the RTAENB 292 signal. It is noted that VDDAR 294 is maintained at full voltage until cycle C1 finishes. After completion of cycle C1, the VDDAR of accessed memory block 250 is dropped to retention voltage. Word line decoder 240 generates word line (WL) 296 in response to the pre-decoded flopped address. Address which is available at the cycle C0 generates corresponding WL 296 in the cycle C1, because input latch and address flop makes a 'master-slave-master' latch configuration. This configuration enables WL 296 to be generated at cycle C1 which corresponds to address available at C0. The VDDAR 296 of the memory block 250 should be charged to full voltage level before WL of a particular row goes high. Read or write operation of the memory is completed in the clock cycle C1 which correspond to address A1 available at the clock cycle C0 (address available one clock cycle earlier).

FIG. 3 is a circuit diagram of the RTA generation logic of FIG. 2(a) according to an embodiment. The circuit diagram illustrates a combination of NAND gate 305 and inverter 310. The NAND gate 305 includes two PMOS transistors and two NMOS transistors configured to be driven by BLK_SEL_FINAL 286 and ADD_PRE 288 respectively. An output of the NAND gate 305 is coupled to an inverter 310, having a PMOS transistor coupled to an NMOS transistor in an inverting configuration. An output of the inverter 310 is the RTA enable signal (RTAENB 292).

RTA logic is driven by BLK_SEL_FINAL 286 and ADD_PRE 288 signals. The RTA enable signal (RTANENB 292) generation is explained under the description of FIG. 2(b). In FIG. 2b the read/write operation in the memory is to be performed at clock cycle C1. Addresses which are available at clock cycle C0 will access corresponding memory location at clock cycle C1. BLK_SEL_FINAL 286 will be going low at the memory active edge of CLK (external clock going high and internal memory clock going low) in cycle C0. As BLK_SEL_FINAL 286 goes low, output of the RTA logic (NAND gate and inverter 305 and 310) RTAENB 292 goes low, that selects RTA switch for the memory block, which is going to be access in the clock cycle C1. ADD_PRE 288, which is second input of RTA logic, goes low at the memory deselecting edge of CLK (external clock CLK going low and memory internal clock goes high) in clock cycle C0. If there is different address available the cycle C1, the BLK_SEL_FINAL of the memory bock which is being accessed in the cycle C1 goes high, but ADD_PRE of the RTA logic remains at low voltage that keeps RTAENB of the memory block which is being accessed in the cycle C1 to low level. After completing the read/write operation at clock cycle C1, when memory goes to inactive state, ADD_PRE of the RTA logic goes high that makes RTAEAB of the memory block, which is accessed in the cycle C1, high after completing R/W operation.

FIG. 4 illustrates an example of an integrated circuit, in the form of a "system-on-a-chip" ("SOC"), as now popular in many electronic systems.

Integrated circuit is a single-chip integrated circuit into which an entire computer architecture is realized. As such, in this example, integrated circuit includes a central processing unit of processor 405, which is connected to system bus SBUS. Various memory resources, including random access memory (RAM) 420 and read-only memory (ROM) 425, reside on system bus SBUS and are thus accessible to processor 405. Typically, ROM 425 serves as program memory, storing the program instructions executable by processor 405, while RAM 420 serves as data memory; in some cases, program instructions may reside in RAM 420 for recall and execution by processor 405. Cache memory 415 is another memory resource, and resides within processor 405 itself and therefore does not require bus access. Other system functions are shown, in a generic sense, in integrated circuit by way of system control 410 and input/output interface 430.

Those skilled in the art having reference to this specification will recognize that integrated circuit may include additional or alternative functions to those shown in FIG. 4, or may have its functions arranged according to a different architecture from that shown in FIG. 4. The architecture and functionality of integrated circuit is thus provided only by way of example, and is not intended to limit the scope of this invention.

The construction of RAM 420 in an integrated circuit will now be described in further detail, with reference to FIG. 2A. In one embodiment, the RAM 420 includes the SRAM configured to be used in the RTA mode as illustrated in FIG. 2A. Of course, a similar construction may be used to realize other memory resources, for example cache memory 415; further in the alternative, RAM 420 may correspond to a stand alone memory integrated circuit. Those skilled in the art having reference to this specification will comprehend that the memory architecture of RAM 420 is provided by way of example only.

RAM 420 also includes or is in communication with test logic, which controls the operation of certain functions within RAM 420 in carrying out read stability, write margin, and read margin tests according to various embodiments. Test logic receives a mode control signal, as issued by other control logic in the integrated circuit (e.g, system control 410), or from an external pin or pad, or in some other manner. It is contemplated that those skilled in the art having reference to this specification, particularly the description of the test functions described below, will be readily able to construct and efficiently place test logic within the integrated circuit containing RAM 420 to carry out those test functions.

Figure 5:
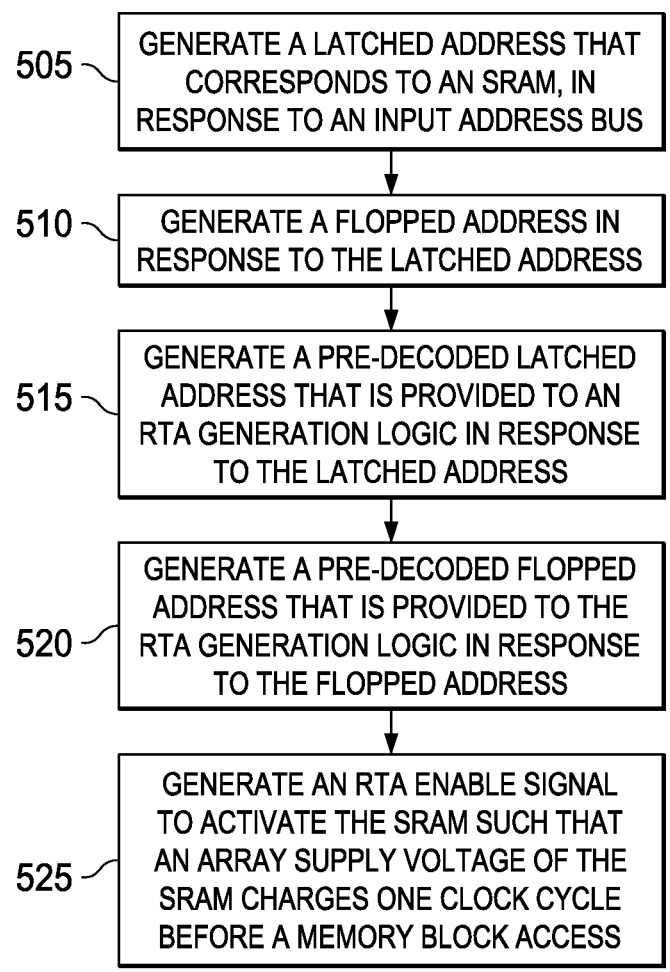
FIG. 5 is a flow diagram according to an embodiment.

FIG. 5 is a flow diagram according to an embodiment. At step 505, a latched address bus that corresponds to an SRAM, in response to an input address is generated. At step 510, a flopped address is generated in response to the latched address. The address flop 210 then saves the latched address bus and generates a flopped address. The address flop 210 includes a master latch and a slave latch that operates in response to an internal clock signal that is generated from the input clock 'CLK'. Then, at step 515, a pre-decoded latched address is generated that is provided to an RTA generation logic in response to the latched address. The flopped address includes MSBs of the input address that are required to select a particular block in the memory array are provided to a second block address pre-decoder stage 225. The second block address pre-decoder stage 225 includes an address pre-decoder 230 and a block address pre-decoder 235 that are configured to receive the LSB and the MSB of the flopped address output.

At step 520, a pre-decoded flopped address is generated that is provided to the RTA generation logic in response to the flopped address. The second block address pre-decoder 235 (hereinafter block address pre-decoder 235) is configured to generate a pre-decoded flopped address to the RTA generation logic 295 in response to the flopped address. The address pre-decoder 230, block address pre-decoder 235 and the block address pre-decoder 270 includes a combination of NAND gates and inverters that operates in response to the respective inputs. At step 525, an RTA enable signal is generated to activate the SRAM such that an array supply voltage of the SRAM charges one clock cycle before a memory block access. The RTA enable signal is generated in response to both the decoded latched address and the decoded flopped address. The RTA enable signal activates the RTA switch such that the SRAM starts charging one clock cycle before a memory block access.

In the foregoing discussion, the terms "connected" means at least either a direct electrical connection between the devices connected or an indirect connection through one or more passive intermediary devices. The term "circuit" means at least either a single component or a multiplicity of passive components, that are connected together to provide a desired function. The term "signal" means at least one current, voltage, charge, data, or other signal. The forgoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of the above teachings, and it is thus intended that the scope of invention not be limited by this Detailed Description, but only by the following Claims.

What is claimed is:

1. A memory configurable to be used in a retention till access (RTA) mode, the memory comprising:
   an input latch configured to receive an input address bus and to generate a latched address bus that corresponds to a memory location;
   an address flop configured to save the latched address bus and to generate a flopped address;
   a first block address pre-decoder stage configured to generate a pre-decoded latched address to a retention till access (RTA) generation logic in response to the latched address bus; and
   a second block address pre-decoder stage comprising a second block address pre-decoder configured to generate a pre-decoded flopped address to the RTA generation logic in response to the flopped address; wherein the RTA generation logic is configured to generate an RTA enable signal one clock cycle before a memory block access, to activate a memory block corresponding to the memory location.

2. The memory of claim 1, wherein:
   the memory includes array of memory cells arranged in rows and columns; and
   the memory block includes a particular set of rows.

3. The memory of claim 1 further comprising an RTA switch that is configured to be activated in response to the RTA enable signal such that the memory block starts charging one clock cycle before an intended operation.

4. The memory of claim 3, wherein a size of the RTA switch and a peak current in the memory is reduced since one clock cycle time is available to charge the array supply voltage of the block.

5. The memory of claim 1, wherein the RTA generation logic is configured to generate an RTA enable signal one clock cycle before a memory block access such that an array supply voltage of the memory block starts charging one clock cycle before an intended operation in the memory location.

6. The memory of claim 1, wherein the RTA generation logic generates the RTA enable signal in response to both the decoded latched address and the decoded flopped address.

7. The memory of claim 1, wherein the RTA generation logic comprises:
   a set of decoders configured to generate the decoded latched address and the decoded flopped address in response to the pre-decoded latched address and the pre-decoded flopped address;
   an RTA flop configured to synchronize the decoded latched address to an internal clock; and
   an RTA logic configured to generate the RTA enable signal in response to the decoded latched address and the decoded flopped address.

8. The memory of claim 7, wherein the RTA logic comprises:
   a NAND gate that receives the decoded latched address and the decoded flopped address; and
   an inverter coupled to the NAND gate that receives an output of the NAND gate and generates the RTA enable signal.

9. The memory of claim 1, wherein the second block address pre-decoder stage further comprises:
   an address pre-decoder configured to generate an output signal, in response to a least significant bit (LSB) of the flopped address, to a word line decoder.

10. The memory of claim 9, wherein the word line decoder is configured to generate a word line to the memory in response to the output signal and the pre-decoded flopped address.

11. The memory of claim 1, wherein:
   the first pre-decoder stage is configured to receive the most significant bits of the latched address bus; and
   the second pre-decoder stage is configured to receive both the most significant bits and the least significant bits of the input address bus.

12. The memory of claim 1, wherein the address flop comprises a master latch and a slave latch coupled to each other that operates in response to the internal clock to generate the flopped address.

13. The memory of claim 1 comprises a static random access memory.

14. A method of operating an SRAM in a retention till access (RTA) mode, comprising:
   generating a latched address that corresponds to an SRAM, in response to an input address bus;
   generating a flopped address in response to the latched address;
   generating a pre-decoded latched address that is provided to an RTA generation logic in response to the latched address;
   generating a pre-decoded flopped address that is provided to the RTA generation logic in response to the flopped address; and generating an RTA enable signal to activate the SRAM such that an array supply voltage of the SRAM charges one clock cycle before a memory block access.

15. The method of claim 14, wherein generating an RTA enable signal comprises:
generating the RTA enable signal in response to both the decoded latched address and the decoded flopped address.

16. The method of claim 14, wherein generating an RTA enable signal comprises:
activating an RTA switch in response to the RTA enable signal such that the SRAM starts charging one clock cycle before a memory block access.

17. The method of claim 14, wherein generating an RTA enable signal comprises:
generating the decoded latched address and the decoded flopped address in response to the pre-decoded latched address and the pre-decoded flopped address;
synchronizing the decoded latched address to an internal clock; and
generating the RTA enable signal in response to the decoded latched address and the decoded flopped address.

18. The method of claim 14, wherein a size of the RTA switch and a peak current in the SRAM is reduced since one clock cycle time is available to charge the array supply voltage of the block.

19. An integrated circuit comprising:
a processor;
a memory coupled to the processor, the memory configurable to be used in a retention till access (RTA) mode, the memory comprising:
an input latch configured to receive an input address bus and to generate a latched address bus that corresponds to a memory location;
an address flop configured to save the latched address bus and to generate a flopped address;
a first block address pre-decoder stage configured to generate a pre-decoded latched address to a retention till access (RTA) generation logic in response to the latched address bus; and
a second block address pre-decoder stage comprising a second block address pre-decoder configured to generate a pre-decoded flopped address to the RTA generation logic in response to the flopped address;
wherein the RTA generation logic is configured to generate an RTA enable signal one clock cycle before a memory block access, to activate a memory block corresponding to the memory location.

20. The memory of claim 19, wherein:
the memory includes array of memory cells arranged in rows and columns;
the memory block includes a particular set of rows;
the RTA generation logic is configured to generate an RTA enable signal one clock cycle before a memory block access such that an array supply voltage of the memory block starts charging one clock cycle before an intended operation in the memory location;
a size of the RTA switch and a peak current in the memory is reduced since one clock cycle time is available to charge the array supply voltage of the block; and
the RTA generation logic generates the RTA enable signal in response to both the decoded latched address and the decoded flopped address, wherein the RTA generation logic comprises:
a set of decoders configured to generate the decoded latched address and the decoded flopped address in response to the pre-decoded latched address and the pre-decoded flopped address;
an RTA flop configured to synchronize the decoded latched address to an internal clock; and
an RTA logic configured to generate the RTA enable signal in response to the decoded latched address and the decoded flopped address.

* * * * *